US009184121B2

(12) United States Patent
Lopez et al.

(10) Patent No.: US 9,184,121 B2
(45) Date of Patent: Nov. 10, 2015

(54) STACKED SYNCHRONOUS BUCK CONVERTER HAVING CHIP EMBEDDED IN OUTSIDE RECESS OF LEADFRAME

(71) Applicant: Texas Instruments Incorporated, Dallas, TX (US)

(72) Inventors: Osvaldo Jorge Lopez, Annandale, NJ (US); Johathan A. Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 94 days.

(21) Appl. No.: 14/173,147

(22) Filed: Feb. 5, 2014

(65) Prior Publication Data

US 2015/0221584 A1    Aug. 6, 2015

(51) Int. Cl.
| | |
|---|---|
| H01L 23/495 | (2006.01) |
| H01L 25/16 | (2006.01) |
| H01L 23/00 | (2006.01) |
| H01L 25/00 | (2006.01) |
| H01L 23/31 | (2006.01) |
| H01L 21/56 | (2006.01) |
| H01L 25/065 | (2006.01) |

(52) U.S. Cl.
CPC .......... *H01L 23/49575* (2013.01); *H01L 21/56* (2013.01); *H01L 23/3107* (2013.01); *H01L 23/49503* (2013.01); *H01L 23/49562* (2013.01); *H01L 24/49* (2013.01); *H01L 24/83* (2013.01); *H01L 24/85* (2013.01); *H01L 25/165* (2013.01); *H01L 25/50* (2013.01); *H01L 23/49524* (2013.01); *H01L 25/0657* (2013.01); *H01L 2224/32145* (2013.01); *H01L 2224/32147* (2013.01); *H01L 2224/32148* (2013.01); *H01L 2224/48091* (2013.01); *H01L 2224/48106* (2013.01); *H01L 2224/48247* (2013.01); *H01L 2224/49171* (2013.01); *H01L 2224/8385* (2013.01); *H01L 2224/83801* (2013.01); *H01L 2224/83851* (2013.01); *H01L 2924/1306* (2013.01); *H01L 2924/1425* (2013.01); *H01L 2924/1426* (2013.01)

(58) Field of Classification Search
CPC ................... H01L 23/49585; H01L 23/49524; H01L 23/0657; H01L 2224/32147; H01L 2224/32148; H01L 2924/14252
USPC .................................................. 257/676, 777
See application file for complete search history.

(56) References Cited

U.S. PATENT DOCUMENTS

| | | | | |
|---|---|---|---|---|
| 2008/0246127 | A1* | 10/2008 | Larking ........................ | 257/664 |
| 2010/0090668 | A1* | 4/2010 | Girdhar et al. ................ | 323/282 |
| 2012/0228696 | A1* | 9/2012 | Carpenter et al. ............ | 257/329 |
| 2012/0256239 | A1* | 10/2012 | Herbsommer et al. ....... | 257/288 |
| 2013/0256852 | A1* | 10/2013 | Wyant et al. .................. | 257/670 |

* cited by examiner

*Primary Examiner* — Ha Tran T Nguyen
*Assistant Examiner* — Aaron Dehne
(74) *Attorney, Agent, or Firm* — Steven A. Shaw; Charles A. Brill; Frank D. Cimino

(57) ABSTRACT

A power supply system (200) has a QFN leadframe with leads and a pad (201, switch node terminal); a pad surface having a portion recessed with a depth (270) and an outline suitable for attaching a semiconductor chip. A first FET chip (220) is vertically stacked to the opposite pad surface. A clip (240) is vertically stacked on the first FET chip and tied to a lead (202, grounded output terminal). A second FET chip (210) has its source terminal attached to the recessed portion and its drain (210*a*, input terminal) and gate (210*b*) terminals co-planar with the un-recessed portion. A driver-and-controller chip (230) is attached to the clip. Packaging compound (290) encapsulates the parts but leaves a pad surface and the drain and gate terminals of the second FET chip un-encapsulated.

20 Claims, 12 Drawing Sheets

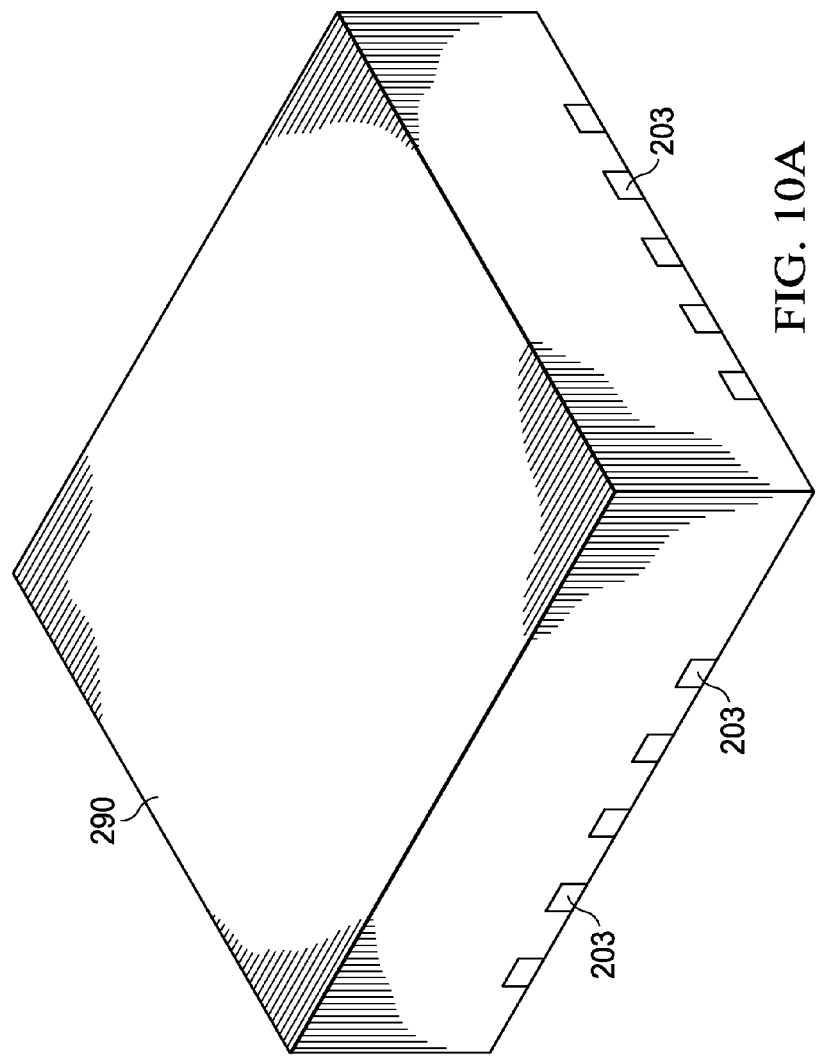

US 9,184,121 B2

STACKED SYNCHRONOUS BUCK CONVERTER HAVING CHIP EMBEDDED IN OUTSIDE RECESS OF LEADFRAME

FIELD

Embodiments of the invention are related in general to the field of semiconductor devices and processes, and more specifically to the structure and fabrication method of packaged synchronous Buck converters, which have stacked chips and clips and also a chip embedded outside the package in a pre-coined recess of the leadframe.

DESCRIPTION OF RELATED ART

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as input/output terminals. In other power switching devices, the power MOSFET chips and the driver-and-controller IC are assembled horizontally side-by-side on a single leadframe pad, which in turn is surrounded on all four sides by leads serving as device input/output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit. In some recently introduced advanced assemblies, clips substitute for many connecting wires. These clips are wide and introduce reduced parasitic inductance. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack, with preferably the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are source-down FETs and are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$. A first clip is connected to the switch node between the two chips; the elongated second clip of the stack top is tied to input supply $V_{IN}$. The pad is at ground potential and also serves as a spreader of operationally generated heat. The driver and control IC is assembled horizontally side-by-side.

A typical converter described in the last paragraph is depicted in FIG. 1, generally designated 100. The control MOS field effect transistor (FET) 110 is stacked upon a synchronous (sync) MOSFET 120. The control FET chip 110 of this exemplary module has a smaller area relative to sync FET chip 120. A QFN metal leadframe has a rectangular flat pad 101, which serves as output terminal and is destined to become the heat spreader of the package; the leads 102a and 102b are positioned in line along two opposite sides of the pad. The stacking of the FET chips is accomplished by the so-called source-down configuration: The source of sync FET 120 is soldered to the leadframe pad 101 by solder layer 121. The low side clip 140, soldered by solder layer 122 onto the drain of sync FET 120, has the source of control FET 110 attached by solder layer 111. Consequently, low side clip 140 thus serves as the switch node terminal of the converter. The high side clip 160 is connected by solder layer 112 to the drain of control FET 110. High side clip 160 is attached to lead 102b of the leadframe and thus connected to the input supply $V_{IN}$. The low side clip 140 and the high side clip 160 are gang placed. The driver and controller chip 130 is attached by solder layer 132 to pad 101. Wires 133 provide the connections of the chip terminals and FET gate terminals (110b, 120b, 120d). The converter of FIG. 1 has a height 191 of 1.5 mm and a rectangular footprint with a length 192 of 6 mm and a width 193 of 5 mm. In other known converters with smaller chips, the driver chip may be placed in top of the second clip to sane board area; for these converters, however, the bonding wires have to be excessively long with significant risk of wire sweep and electrical short during the encapsulation process.

SUMMARY

Applicants realized that that the ongoing trend of employing DC-DC converters in new applications, such as automotive products, accelerates the long-standing drive towards miniaturization, lower power, and reduced cost. Symptoms of this trend are the pushes for reducing the height of converters and the reduction of board real estate consumed of the converter.

Applicants further realized that a step function improvement in reducing the height of stacked converters and shrinking the board area consumed could be achieved when an element of the stacked converter could be eliminated without eliminating the function of that element. For DC-DC converters with a vertically stacked assembly of chips and clips on a leadframe, applicants found a way of eliminating a clip while retaining its function, when they discovered a method of re-arranging the overall assembly of chips, clips and leadframe together with re-arranging the electrical current flow. As unexpected side benefits, it turned out that the new hierarchy reduces parasitics of the converter, increases its speed, and simplifies the assembly flow.

One embodiment of the invention is a DC-DC converter vertically stacked on a QFN leadframe with a pad of a first and a second surface. A portion of the first surface is pre-coined with a recess to create a depth and an outline suitable for attaching a semiconductor chip. On the second surface, a first FET chip is vertically stacked to the pad by having its drain terminal attached to the second pad surface. A clip is vertically stacked on the first FET chip with a first flat side attached to the source terminal. A driver-and-controller chip is vertically attached to the second flat clip side. The structure is then molded, or otherwise encapsulated, while leaving the bottom of the pre-coined pad and the leads exposed. After encapsulation, a second FET chip has its source terminal attached to the recessed (pre-coined) portion of the first pad surface so that its drain and gate terminals are co-planar with the un-recessed portion of the first pad surface and the exposed leads. The second chip is an exposed, unmolded chip. This fully integrated power supply system has the pad tied to the switch node of the system, the clip to the grounded output terminal of the system, and the drain of the second FET to a board terminal as input to the system.

Another embodiment of the invention is a method for fabricating a power supply system. A leadframe with leads and a pad with a first and a second surface has a portion of the first pad surface recessed (pre-coined) with a depth and an outline suitable for attaching a semiconductor chip. A first FET chip is attached with its drain terminal on the second surface of the pad. A clip is then attached with its first flat side vertically on the source terminal of the first FET chip; on its second flat side, which is the top of the clip, a driver-and-control chip is attached. The terminals of the driver-and-control chip are then attached to respective leads using bonding wires. Thereafter, the vertically stacked driver-and-controller chip, the clip, the first FET chip, and the second pad surface are encapsulated in a packaging compound, while the first pad surface is left un-encapsulated. A second FET chip is attached with its source terminal to the recessed portion of the first pad surface so that the drain and gate terminals of the second FET chip are co-planar with the un-recessed portion of the first pad surface. Electrically, the pad is connected to the switch node terminal of the system, the clip to the grounded output terminal of the system, and the drain of the second FET chip to a board terminal as input to the system.

Compared to conventional power supply systems, the invention saves board real estate by fully integrating the driver-and-controller chip into the vertical stack, and by shortening the bonding wire length to a value save against wire sweep. The invention further saves height of the stacked system by embedding one FET chip into the partially thinned leadframe pad. This feature allows the elimination of the conventional second clip without abandoning its function. As a consequence, the resistance of the second clip is eliminated, thus improving the speed of the converter and reducing its parasitic loss; in addition, the assembly flow is shortened, reducing the manufacturing cost.

BRIEF DESCRIPTION OF THE DRAWINGS

FIG. 10A illustrates a top perspective view of the encapsulated converter.

DETAILED DESCRIPTION OF THE PREFERRED EMBODIMENTS

Figure 2A:
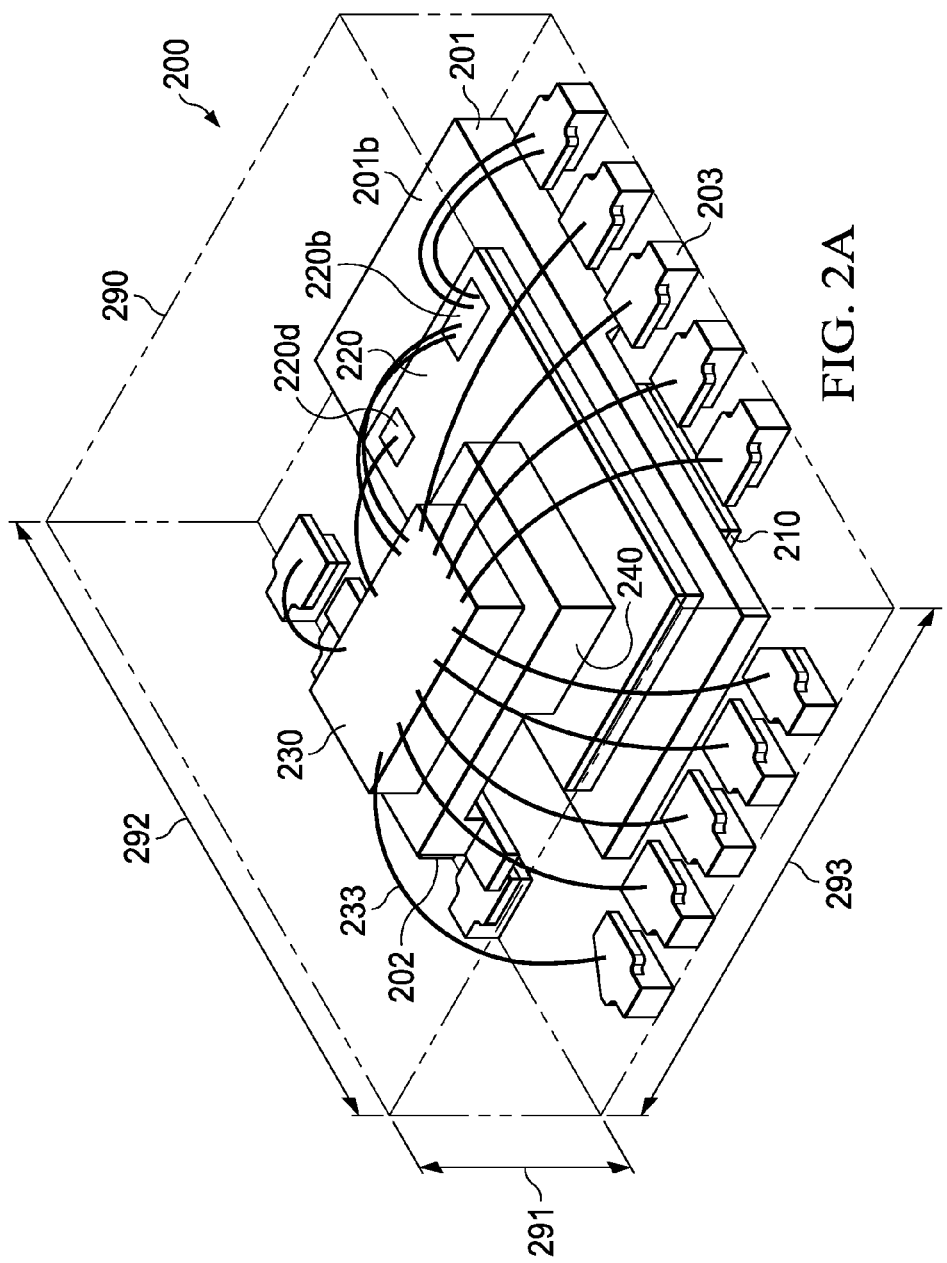
FIG. 2A illustrates a perspective top view of a synchronous Buck converter according to an exemplary embodiment of the invention, with the driver-and-controller chip vertically stacked with the FET chips and a single clip.
Figure 2B:
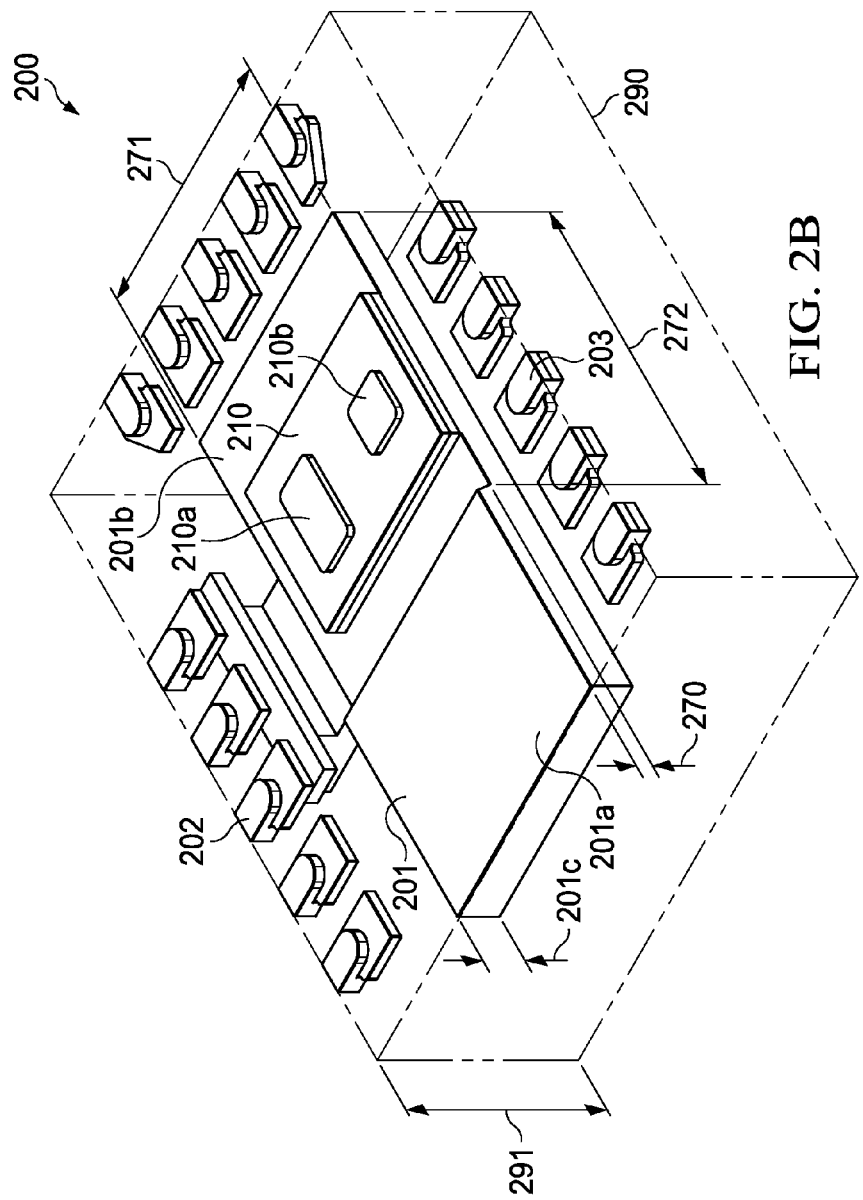
FIG. 2B shows a perspective bottom view of the converter of FIG. 2A, depicting an FET chip embedded in an outside recess of the leadframe pad.

FIGS. 2A and 2B illustrate perspective views of a power supply module generally designated 200 as an exemplary embodiment of the invention, FIG. 2A as a top view, FIG. 2B as a bottom view. For explanatory reasons, module 200 is shown with a transparent encapsulation 290. Preferred actual encapsulation uses a black-colored epoxy formulation for a transfer molding technology. The exemplary module of FIGS. 2A and 2B has a thickness 291 of 1.0 mm and a square-shaped footprint with a module length 292 of 3.0 mm and a width 293 of 3.0 mm. Other pads may be rectangular.

Visible through the transparent encapsulation is a metal leadframe generally suitable for Quad Flat No-Lead (QFN) and Small Outline No-Lead (SON) type modules. The leadframe includes a rectangular pad 201 and a plurality of leads 202 and 203. The pad surface visible in FIG. 2B is the first surface 201a, the pad surface visible in FIG. 2A is the second surface 201b. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. In addition, at least one surface may have a metal layer deposited to enhance thermal conductivity, for instance by a plated layer of silver. Preferred thickness 201c of the leadframe metal for the exemplary embodiment shown in FIGS. 2A and 2B is in the range from 0.2 mm to 0.4 mm; other embodiments may use thicker or thinner leadframe metal. From the standpoint of low cost and batch processing, it is preferred to start with sheet metal and fabricate the leadframe as a strip by stamping or etching, and to singulate the leadframe for the module by trimming the strip after the encapsulation process. Electrically, pad 201 is tied to the switch node terminal $V_{SW}$ of the power supply system.

As illustrated in FIG. 2B, first pad surface 201a has a portion 201b recessed with a depth 270 and an outline (length 271 and width 272) suitable for attaching a semiconductor chip. Recess 201b is preferably accomplished by coining or etching during the fabrication process of the leadframe. As an example, the a chemical etching process may be performed so that only those surfaces (for instance copper or aluminum) are attacked which are not protected by a sequence of nickel, palladium and gold layers. In the example of FIG. 2B, the attached semiconductor chip is a source-down FET chip 210, which represents the control FET (high side FET) of a synchronous Buck converter. For the exemplary embodiment shown in FIG. 2B, the length 271 of the recessed portion is identical with the width of the leadframe pad 201. In other applications, the recessed portion may be suitable for attaching an integrated circuit chip.

FIG. 2B shows the control FET (high side FET) chip 210 with its source terminal attached to pad 201. Herein, control FET chip 210 is referred to as second FET chip. For the embodiment shown in FIG. 2B, second chip 210 has a size of about 2.5×1.8 mm, and a thickness of 0.1 mm. For other embodiments, the chip size and the chip thickness may have significantly greater or smaller values. The attachment is preferably achieved by a layer of conductive adhesive (epoxy), which can be polymerized (cured); an alternative is a z-axis conductive polymer. After attachment, the drain terminal 210a and the gate terminal 210b are co-planar with the surface 201a of the un-recessed portion of the first pad surface. The drain terminal 210a is available, after flipping the finished device, to be attached (by solder or conductive adhesive) to the input terminal $V_{IN}$ on the motherboard. This attachment action also ties the control FET gate terminal 210b to the respective terminal on the board.

The example of FIG. 2A shows the sync FET (low side FET) chip 220 assembled on the second surface 201b of leadframe pad 201. Herein, sync FET (low side FET) chip 220 is referred to as first FET chip. First chip 220 has a drain-down FET with its drain attached to pad 201. The attachment is preferably achieved by a layer of solder. For the embodiment shown in FIG. 2A, first chip 220 has a thickness of 0.1 mm. For other embodiments, the chip size and the chip thickness may have significantly smaller or to greater values. The preferred thickness of the solder layer is at least 25 µm. The solder material, for instance a solder paste, is selected so that the same material can be used for all solder joints of the power supply module, allowing a single solder reflow step for assembling the module. The layered sequence of second FET chip/conductive epoxy layer/leadframe pad/solder layer/first FET chip forms a vertically assembled stack.

In FIG. 2A, the first (sync) FET terminals metallurgically suitable for wire bonding are designated 220b for the gate and 220d for the gate return. Continuing the vertical stacking, the source terminal of first FET 220 is coupled by a solder layer to clip 240. The flat portion of clip 240 is vertically attached on the first FET chip by having a first flat clip side attached to the source terminal. Clip 240 is tied to lead 202 which electrically represents the grounded output terminal of the system. Clip 240 has a structure to function as at its second flat side for enabling the attachment of driver-and-controller chip 230. Clip 240 is preferably made of copper in the thickness range from about 0.2 to 0.3 mm; both surfaces of clip 240 are preferably solderable. Clip 240 is preferably employed in strip form and etched to acquire its contours and thicknesses; the strip is trimmed after encapsulating the module in compound 290, leaving tie bars shown as residues.

As illustrated in FIG. 2A, vertically attached to the top side (second flat side) of clip 240 is integrated circuit (IC) chip 230, providing driver and controller functions for the power supply system. Chip 230 has back side metallization to allow attachment to the second flat side of clip 240; the attachment preferably uses a solder layer of about 25 µm thickness. The metallic solder provides high thermal conductivity for spreading heat from chip 230 to clip 240. Chip 230 may be square shaped (side length about 1.4 to 1.5 mm) and 0.2 mm thick, or it may be rectangular, as shown in the example of FIG. 2A. Other embodiments may have chips, which are smaller or greater, and thicker or thinner. As illustrated in FIG. 2A, the terminals of chip 230 are wire bonded to respective leads 203. The preferred diameter of bonding wires 233 is about 25 µm, but may be smaller or greater. While this bonding configuration implies so-called downhill bonding operation, which requires care during the molding operation in order to for avoid wire sweep and the correlated touching of a wire and clip 240 or chip 220, the bonding in FIG. 2A has actually only low risk due to the short wires and the small height difference (the thicknesses of only one clip and one chip) to be overcome between chip 230 and leads 203.

FIG. 2B shows a bottom view of the encapsulated exemplary module 200. The first surfaces of leadframe pad 201 and of leads 202 and 203 are exposed from encapsulation compound 290 and have solderable surfaces to allow solder attachment to terminals of a board. As stated above, for this exemplary embodiment, pad 201 may be square-shaped or rectangular, and has a portion recessed with a depth 270 and an outline (length 271 and width 272) suitable for attaching a semiconductor chip. In the example of FIG. 2B, the attached semiconductor chip is a source-down FET chip 210, which represents the control FET (high side FET) of a synchronous Buck converter and is with its source terminal attached to pad 201. After attachment, the drain terminal 210a and the gate terminal 210b are co-planar with the surface 201a of the un-recessed portion of the first pad surface and with the leads.

Figure 1:
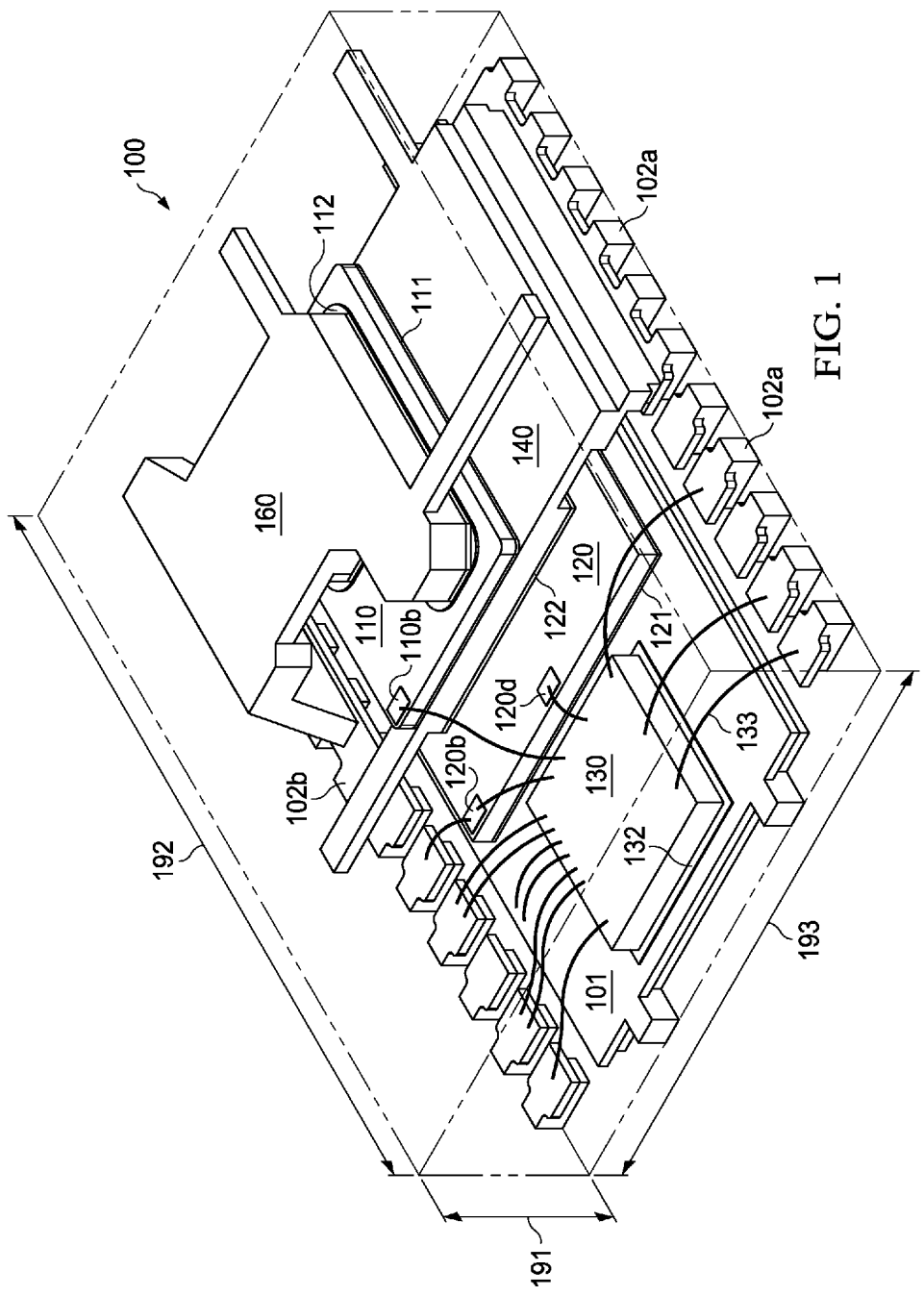
FIG. 1 shows a perspective top view of a synchronous Buck converter with the driver-and-controller chip assembled adjacent to the vertically stacked FET chips and two clips on a leadframe pad according to prior art.
Figure 3:
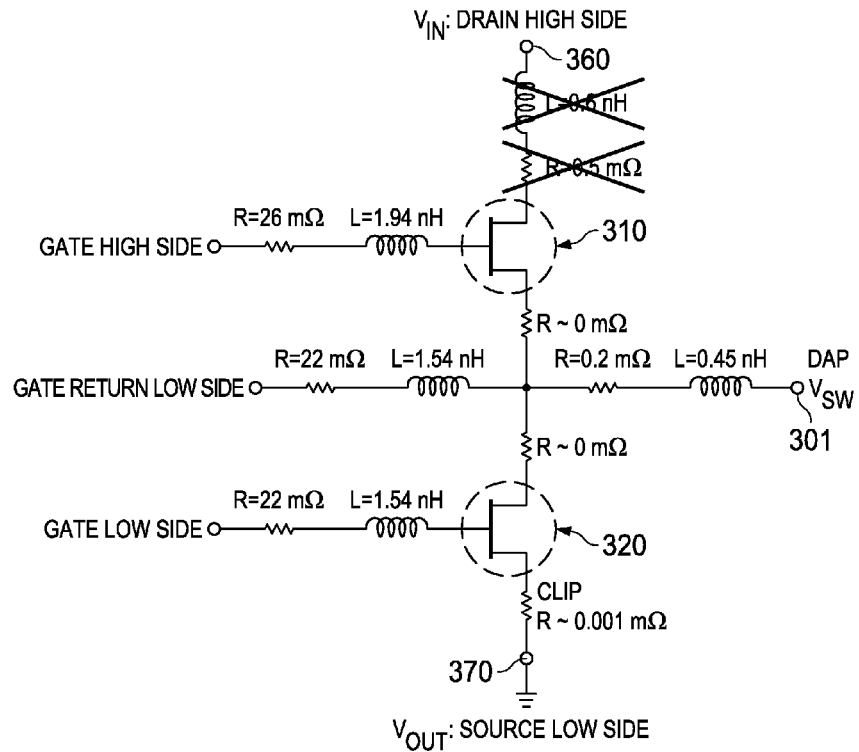
FIG. 3 displays a circuit diagram of the synchronous Buck converter of FIGS. 2A and 2B, identifying the elimination of electrical parasitics due to the avoidance of a second clip.

Assembling a synchronous Buck converter according to FIGS. 2A and 2B reduces parasitic inductances prevalent in conventional assembly. FIG. 3 specifies the improvements relative to the conventional assembly shown in FIG. 1 and originating from omitting the second clip needed in the vertical stacking of the conventional assembly. Without the second clip, the drain terminal of the high side FET 310 is directly mounted onto the $V_{IN}$ terminal 360 of the board. Thus, a parasitic resistance of about 0.5 mΩ and a parasitic inductance of about 0.6 nH from the omitted clip are avoided; the parasitic resistance and inductance the input terminal $V_{IN}$ have practically vanished.

The source of the low side FET 320 is tied by the clip to the grounded output $V_{OUT}$ (designated 370) of the system. The resistance of the clip is small due to the thick copper material of the clip. The pad of the leadframe is tied to the switch node terminal $V_{SW}$, designated 301.

Another embodiment of the invention is a method for fabricating a stacked power supply system, which, compared to prior art, has a chip embedded in an outside recess of its leadframe pad, eliminates one clip and reduces the number of process steps so that the method is low cost compared to prior art and produces a small-thickness and small-area device. FIGS. 4 to 12 depict certain steps of the assembly process flow.

Figure 4:
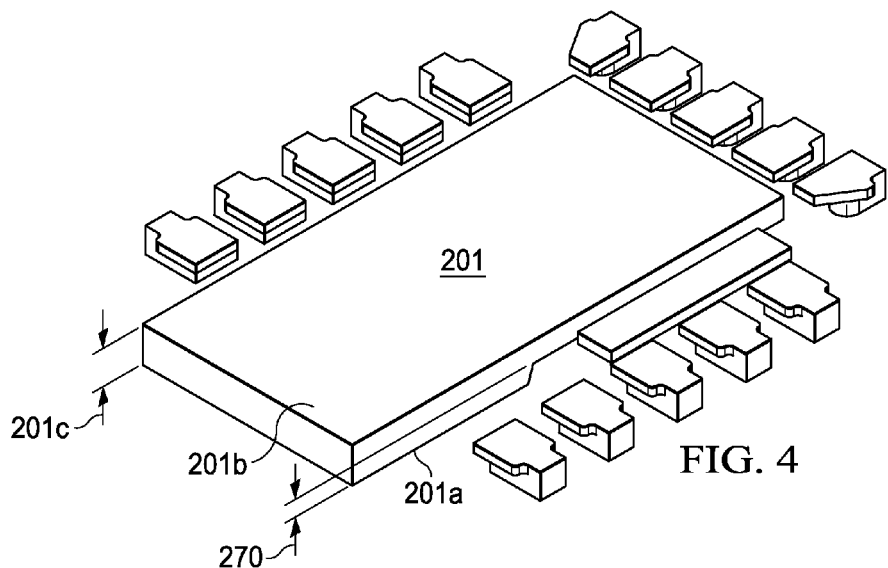
FIG. 4 shows a perspective top view of the leadframe.

The process flow starts in FIG. 4 by providing a leadframe of thickness 201c, which has a rectangular or square-shaped pad 201 with a first (201a) and a second (201b) surface. Pad 201 will be tied to the switch terminal $V_{SW}$. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. Preferred thickness 201c of the leadframe metal is in the range from 0.2 mm to 0.4 mm. It is preferred to start with sheet metal and fabricate the leadframe as a strip by stamping or etching, and to singulate the leadframe for the module by trimming the strip after the encapsulation process. The top view of FIG. 4 illustrates second surface 201b. The first surface 201a is intended to remain exposed outside the device package; first surface 201a has a portion recessed with a depth 270 and an outline suitable for attaching a semiconductor chip. The recess may be accomplished by a coining or an etching technique. For some applications, the recess may be about half of the pad thickness; consequently, a leadframe with portions of such recess is often referred to as half-etched or partially etched leadframe.

Figure 5:
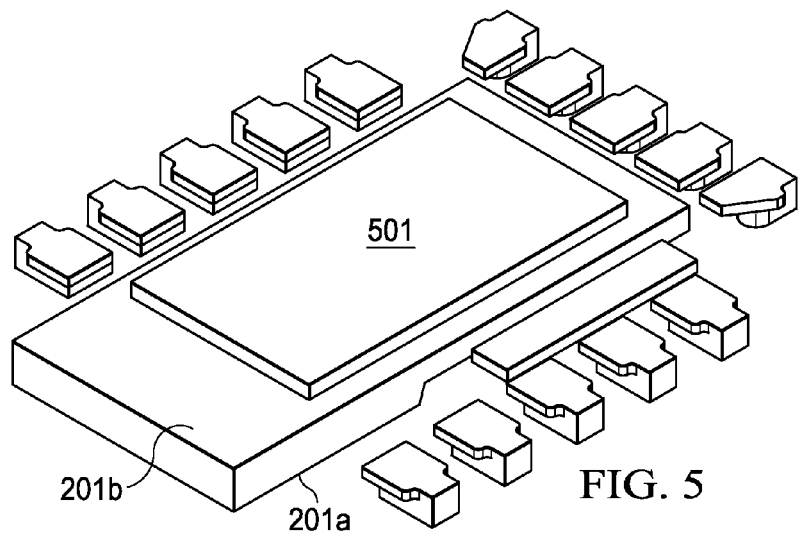
FIG. 5 depicts the step of depositing a layer of solder or conductive adhesive.

FIG. 5 depicts the next process step, the dispensing or screen printing of a layer 501 of solder or solder paste on the second pad surface 201b. A preferred layer thickness is about 25 μm. The solder is selected so that the material is suitable for all solder joints of the product; all solder layers can thus undergo melting simultaneously during a unified reflow step. Alternatively, a conductive adhesive may be used which needs to be polymerized (cured) at an elevated temperature.

Figure 6:
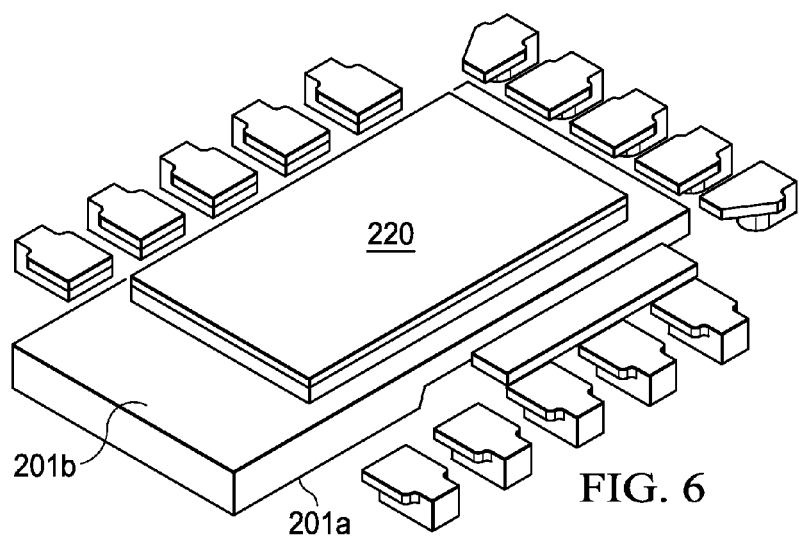
FIG. 6 illustrates the step of attaching a first FET chip (low side FET).
Figure 7:
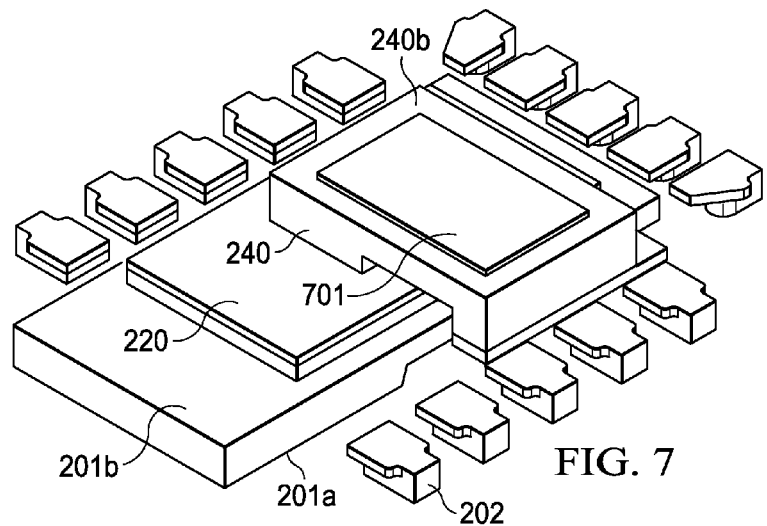
FIG. 7 shows the steps of dispensing solder layer, attaching a clip with its flat side vertically on the first FET chip, and dispensing another solder layer on top of the clip.

In FIG. 6, the first, or low side, FET chip 220 with a drain-down design is attached with its drain terminal on the solder layer and thus on the second surface of the pad. Source and gate terminals are facing away from the pad surface 201b. In FIG. 7, another layer of solder is dispensed on the source terminal of chip 220; then, a clip 240 is attached with its first flat side on this solder layer and thus on the source terminal of first FET chip 220. Clip 240 is configured to allow contact to leads 202, which are output terminals and tied to ground. Also shown in FIG. 7 is the step to dispense a layer 701 of solder onto the second flat side 240b of clip 240.

Figure 8:
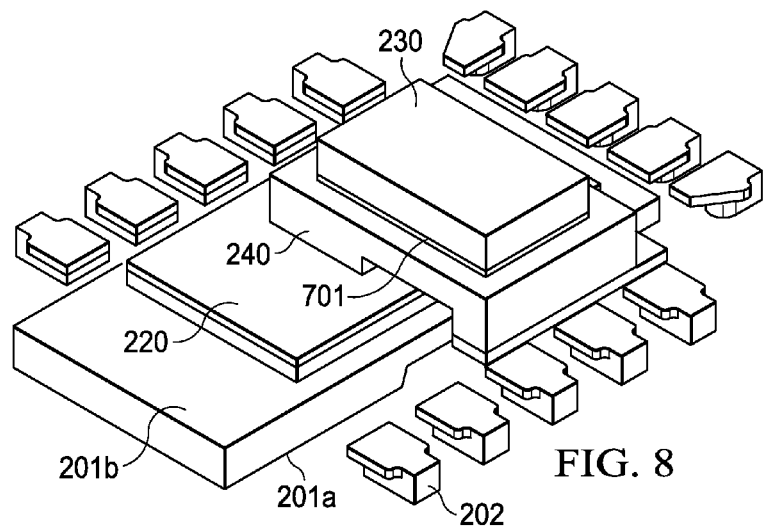
FIG. 8 depicts the step of attaching a driver-and-control chip vertically onto the clip.

In contrast to the conventional assembly flow, which would register, as next step, the attachment of the high side FET onto the clip, FIG. 8 depicts as next process step the attachment of chip 230 with the driver and controller IC onto the second flat side 240b of clip 240. After attaching chip 240, the temperature is raised to reflow all solder materials to finalize the assembly of the solder-attached parts; a clean-up step eliminates any residual flux.

Figure 9:
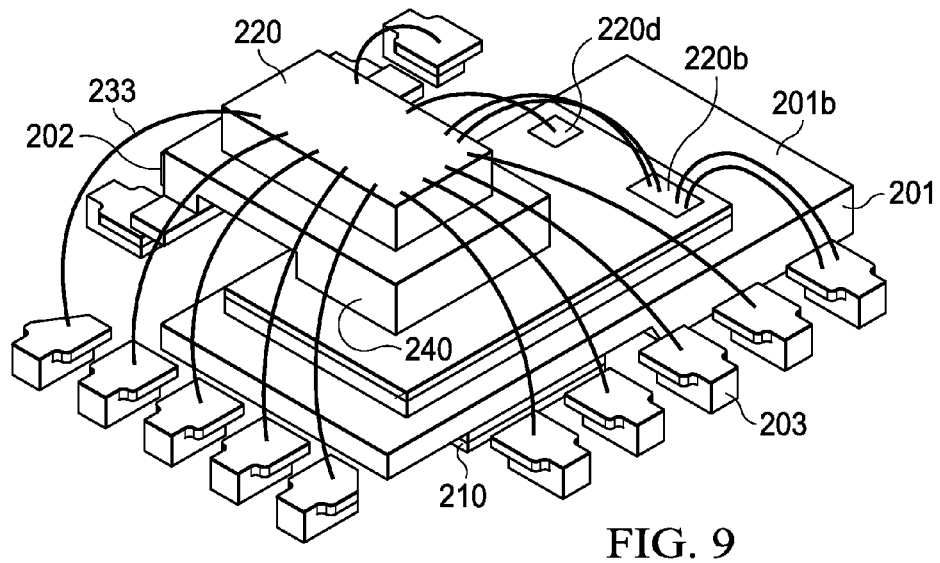
FIG. 9 shows the step of wire bonding the terminals of the driver-and-control chip to respective leads.

FIG. 9 illustrates the next process step of wire bonding. Included in this step are the wire connections 233 of the terminals of the driver-and-controller chip 230 to respective leads and gate and gate returns of the low side FET chip 220, as well as the wire connection of gate 220b to its respective lead.

Figure 10B:
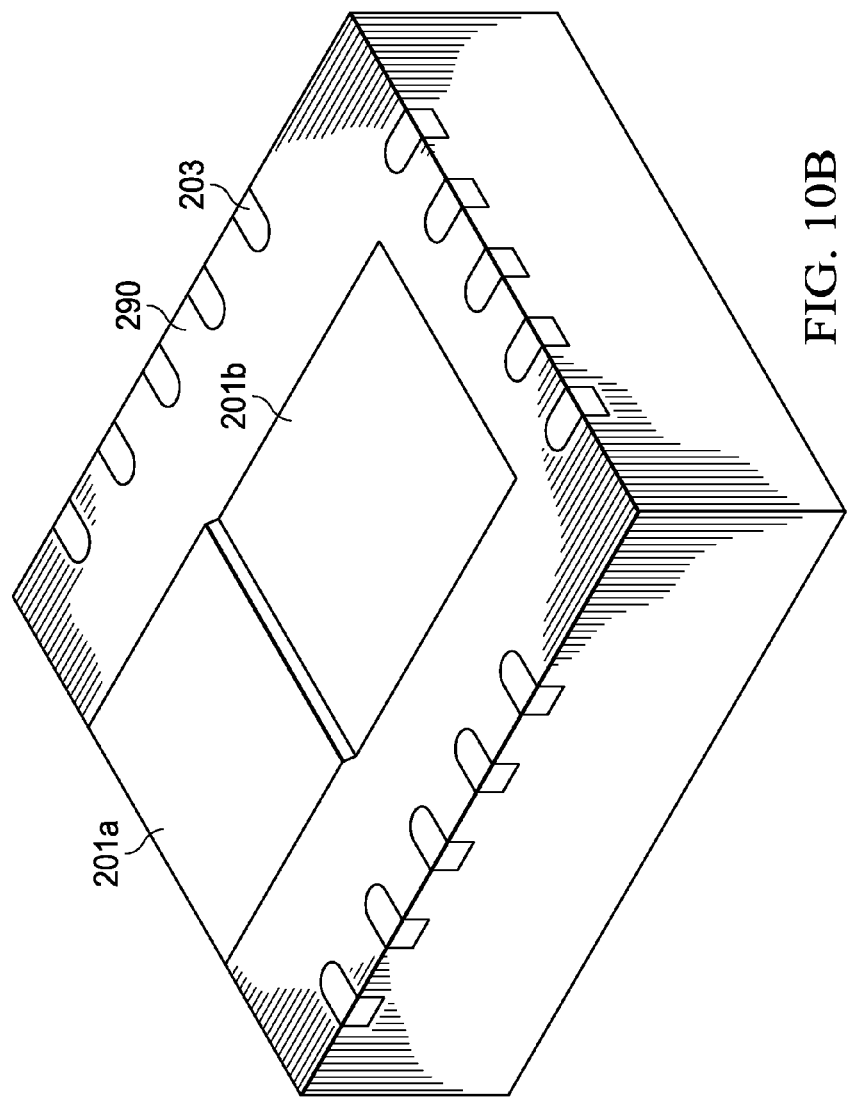
FIG. 10B shows a bottom perspective view of the encapsulated converter with a pre-coined recess portion in the surface of the leadframe pad.

The next process step, depicted in FIGS. 10A (top view) and 10B (bottom view), includes the encapsulation of the driver-and-control chip 230, the clip 230, the first FET chip 220, and the second pad surface 201b in a packaging material, preferably a molding compound 290. The bottom view of FIG. 10B shows that the first pad surface 201a remains un-encapsulated. This un-encapsulated first surface 201b includes the recessed portion 201b, which has a depth and lateral dimensions suitable for attaching a semiconductor chip.

Figure 11:
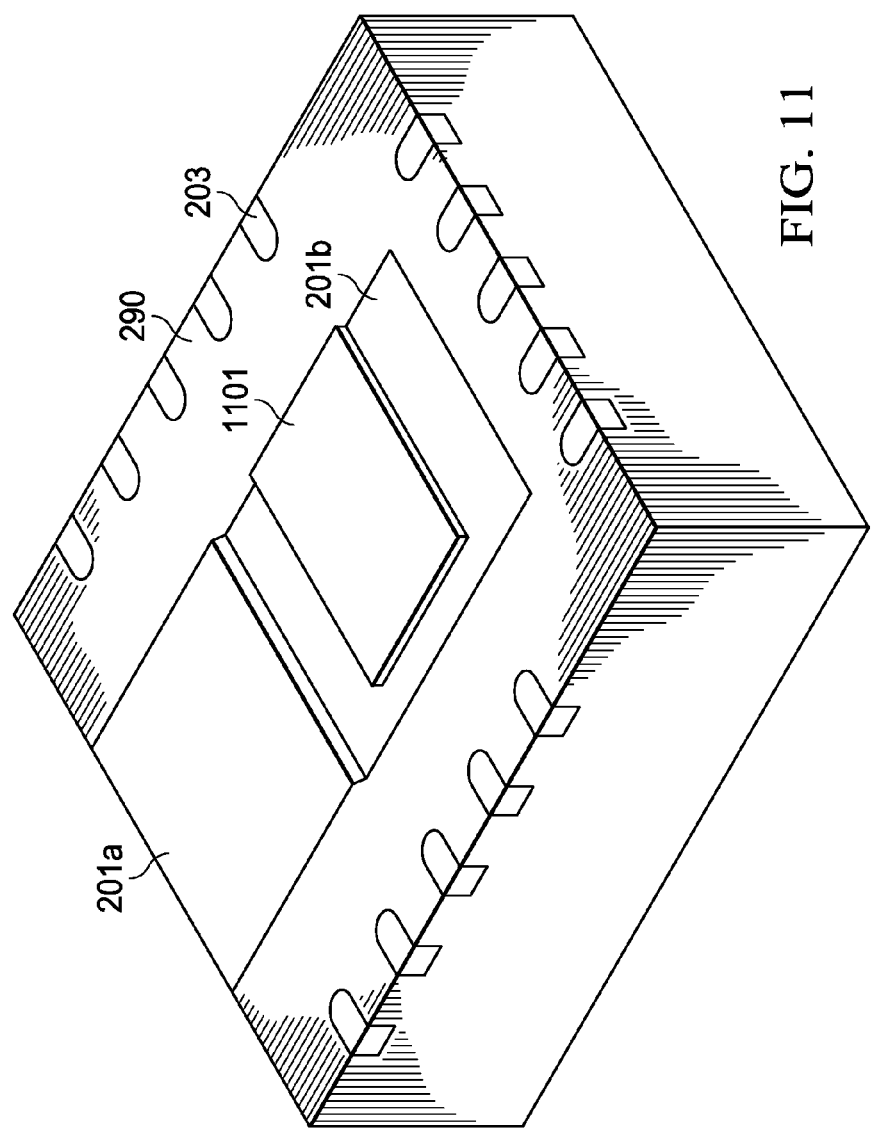
FIG. 11 depicts the step of depositing a layer of conductive adhesive polymer on the recessed (pre-coined) surface.
Figure 12:
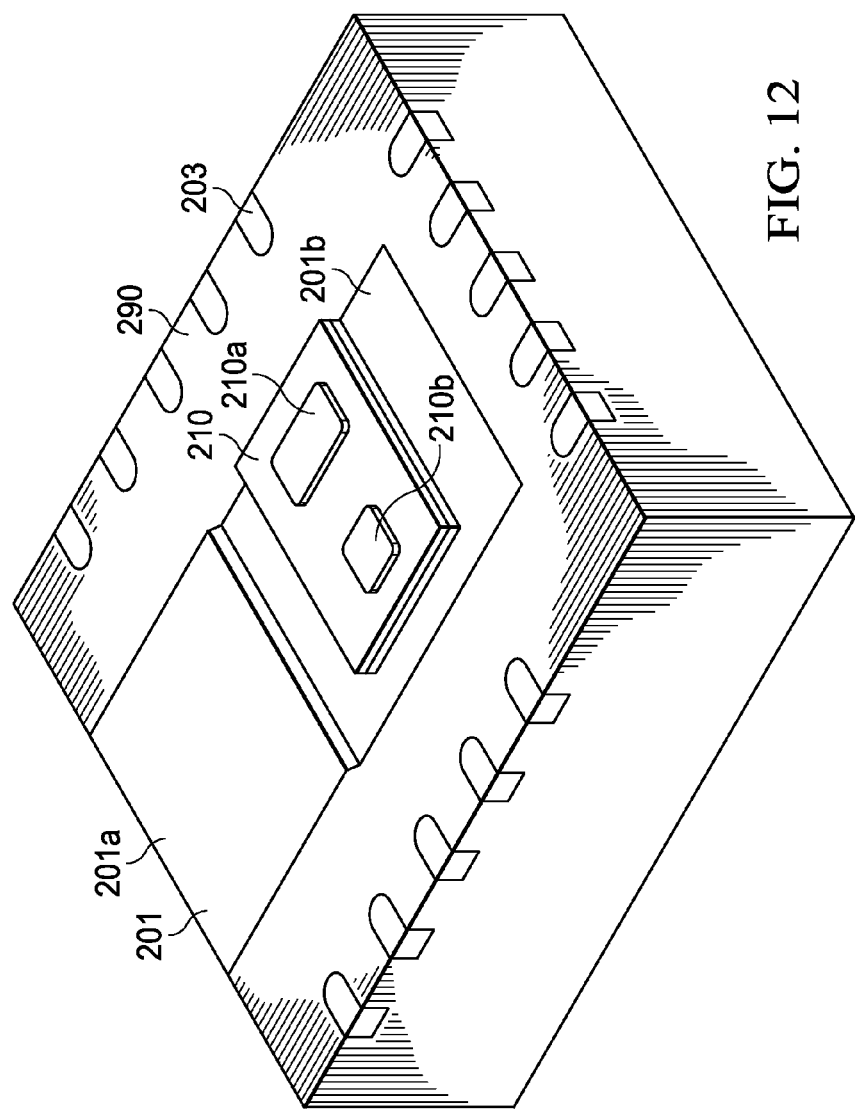
FIG. 12 shows the step of attaching a second FET chip (high side FET) on the adhesive layer of the recessed (pre-coined) surface.

FIG. 11 shows the step of dispensing a layer 1101 of conductive epoxy on the recessed portion 201b of the first pad surface 201a. FIG. 12 illustrates the step of attaching the second FET (high side FET) chip 210 with its source terminal onto the epoxy layer 1101 and thus the leadframe pad 201. The attachment is performed so that after the attachment the drain terminal 210a and the gate terminal 210b of chip 210 are co-planar with the un-recessed portion of first pad surface 201a and thus also co-planar with the leads. Due to the co-planarity, drain terminal 210a can be attached (for instance by solder or by conductive adhesive) to a PC board terminal functioning as input $V_{IN}$ to the system. This direct attachment of the second chip to the board as the advantage of eliminating parasitic resistance and inductance, and enhancing the heat dissipation during system operation from the system directly into a heat sink of the board.

Figure 13:
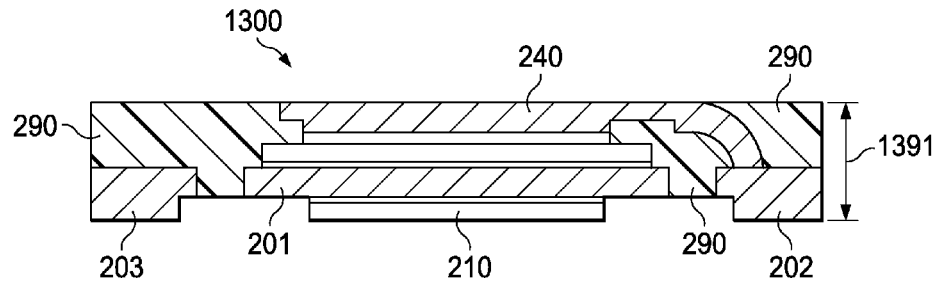
FIG. 13 shows a cross section of a thin converter with un-encapsulated clip surface for dual cooling according to another exemplary embodiment.

Another embodiment of the invention is applicable to products, where the thinness of the converter is at a premium, or where cooling of the converter has to be maximized. An example of an ultra-thin device 1300 is illustrated in FIG. 13. In this embodiment, the driver-and-controller chip is not assembled on top of the stack as in FIG. 2A, but rather in close proximity adjacent to the stack. Instead, the flat portion of clip 240 remains un-encapsulated and exposed for the adhesion of an external heat sink. Since high side FET chip 210 is also exposed and ready to be attached to a heat spreader in the PC board, converter device 1300 is dual cooled and thus suited for high efficiency and high frequency operation (1 MHz and above). The surface of chip 210 with the terminals of source and gate of the high side FET is co-planar with the surface (not shown in FIG. 13) of the un-recessed pad 201 and the leads 202 and 203. With this co-planarity and the exposed flat clip surface, the height 1391 of the converter 1300 is only 0.477 mm.

Figure 14:
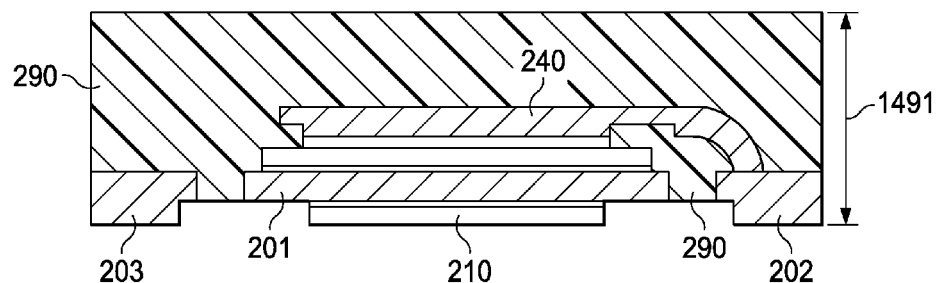
FIG. 14 depicts a cross section of a converter according to another embodiment of the invention.

For applications requiring a converter with a robust housing or high resistance against warping, the clip may be fully surrounded by packaging material, as illustrated in FIG. 14. In this embodiment, the converter height 1491 may be about 1.0 mm; thicker or thinner heights are feasible.

Figure 15:
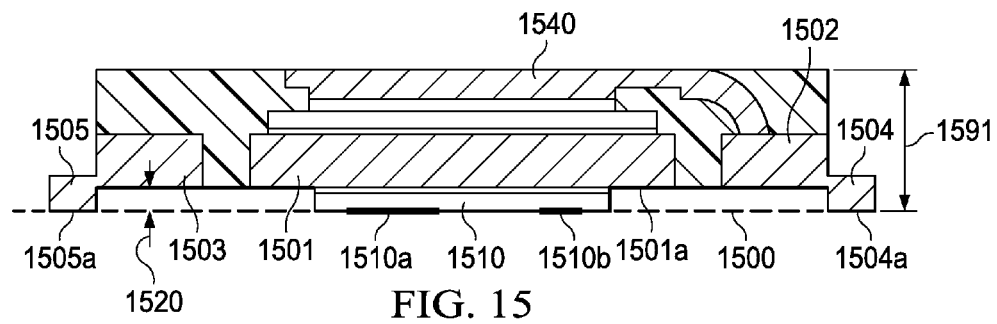
FIG. 15 illustrates a cross section of a converter according to yet another embodiment of the invention.

As another embodiment of the invention, the leadframe of some devices may be restructured so that the co-planarity of the terminals bottom-attached chip with the leadframe leads can be achieved without recessing, pre-coining, or partially etching the leadframe pad. An example of a power block with these features is illustrated in FIG. 15. The leadframe pad 1501 does not have a recessed first surface 1501a. Second FET chip 1510 can be attached to first surface 1501a and have its outside terminals 1510a (drain) and 1510b (gate) co-planar with lead surfaces 1504a and 1505a facing a board. The co-planarity is achieved by structuring the leads 1502 and 1503 so that they have protrusions 1504 and 1505 with surfaces 1504a and 1505a beyond the plane of the first surface 1501a; the protrusions have a height 1520, which is suitable for attaching a semiconductor chip to the first pad surface 1501a while keeping the un-attached chip surface with chip terminals 1510a and 1510b coplanar with the lead protrusion surfaces 1504a and 1505a. Surfaces 1504a and 1505a extend over first surface 1501a by an amount equal the thickness of chip 1510. The plane designated 1500 is the joint plane for chip terminals 1510a and 1505b and the leadframe protrusion surfaces 1504a and 1505a, allowing a uniform attachment of the device to a board. For exemplary devices, total height 1591 of the converter of FIG. 15 may be about 0.50 mm. In the exemplary device of FIG. 15, the dual cooling capability is maintained analogous to the device discussed in FIG. 13. On other embodiments, clip 1540 may be fully covered with encapsulation compound While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the high current capability of the power supply module can be further extended, and the efficiency further enhanced, by leaving the top surface of the clip un-encapsulated so that the clip can be connected to a heat sink, preferably by soldering. In this configuration, the module is dual cooled and can dissipate its heat from both large surfaces to heat sinks.

It is therefore intended that the appended claims encompass any such modifications or embodiments.

We claim:

1. A power supply system comprising:
   a QFN leadframe having a plurality of leads and a pad with a first and a second pad surface, the first pad surface having a recessed portion and an un-recessed portion, the recessed portion having a depth and an outline suitable for attaching a semiconductor chip, the pad tied to a switch node terminal of the system;
   a first FET chip vertically stacked to the pad by having a drain terminal of the first FET chip attached to the second pad surface;
   a clip vertically stacked on the first FET chip by having a first flat side attached to a source terminal of the first FET chip, the clip tied to a lead from the plurality of leads as a grounded output terminal of the system; and
   a second FET chip having a source terminal of the second FET chip attached to the recessed portion of the first pad surface, and further having a drain terminal of the second FET chip and a plurality of gate terminals co-planar with the un-recessed portion of the first pad surface, the drain of the second FET chip tied to a board terminal as an input terminal to the system.

2. The system of claim 1 wherein the first FET chip includes a drain down FET, which serves as a low-side transistor.

3. The system of claim 2 wherein the second FET chip includes a source down FET, which serves as a high-side transistor.

4. The system of claim 1 further including a package encapsulating the clip, the first FET chip, and the second pad surface, but leaving the first pad surface and at least some of the plurality of leads un-encapsulated.

5. The system of claim 1 further including a package encapsulating a portion of the clip, the first FET chip, and the second pad surface, but leaving the first pad surface, at least some of the plurality of leads, and the clip surface opposite the first FET chip un-encapsulated.

6. The system of claim 1 further including a driver-and-controller chip vertically stacked on the clip by being attached to the second flat clip side.

7. The system of claim 6 wherein the driver-and-controller chip having a plurality of terminals tied by bonding wires to respective leads of the leadframe.

8. The system of claim 7 further including a package encapsulating the driver-an-controller chip, the wires, the clip, the first FET chip, and the second pad surface, but leaving the first pad surface and at least some of the plurality of leads un-encapsulated.

9. The system of claim 1 wherein the power supply system is a vertically stacked DC-DC converter system.

10. A power supply system comprising:
    a QFN leadframe having a plurality of leads and a planar pad with a first and a second pad surface, at least some of the plurality of leads having protrusions beyond the plane of the first surface, the protrusions having a height suitable for attaching a semiconductor chip to the first pad surface while keeping the un-attached chip surface coplanar with the lead protrusions; the pad tied to a switch node terminal of the system;
    a first FET chip vertically stacked to the pad by having a drain terminal of the first FET chip attached to the second pad surface;
    a clip vertically stacked on the first FET chip by having a first flat side attached to a source terminal of the first FET chip, the clip tied to a lead from the plurality of leads as a grounded output terminal of the system; and
    a second FET chip having a source terminal of the second FET chip attached to the first pad surface, and further having a drain terminal of the second FET chip and a plurality of gate terminals co-planar with the lead protrusions, the drain of the second FET chip tied to a board terminal as an input terminal to the system.

11. The system of claim 10 further including a package encapsulating the clip, the first FET chip, and the second pad surface, but leaving the first pad surface and at least some of the plurality of leads un-encapsulated.

12. The system of claim 10 further including a package encapsulating a portion of the clip, the first FET chip, and the second pad surface, but leaving the first pad surface, at least some of the plurality of leads, and the clip surface opposite the first FET chip un-encapsulated.

13. The system of claim 10 further including a driver-and-controller chip vertically stacked on the clip by being attached to the second flat clip side.

14. The system of claim 13 wherein the driver-and-controller chip having a plurality of terminals tied by bonding wires to respective leads of the leadframe.

15. The system of claim 14 further including a package encapsulating the driver-an-controller chip, the wires, the clip, the first FET chip, and the second pad surface, but leaving the first pad surface and at least some of the plurality of leads un-encapsulated.

16. A method for fabricating a power supply system comprising the steps of:
    providing a leadframe having leads and a pad with a first and a second surface, the first surface having a portion recessed with a depth and an outline suitable for attaching a semiconductor chip;
    attaching a first FET chip with its drain terminal vertically on the second surface of the pad;
    attaching a clip with its first flat side vertically on the source terminal of the first FET chip;
    encapsulating the clip, the first FET chip and the second pad surface in a packaging compound, while leaving the first pad surface un-encapsulated; and
    attaching a second FET chip with its source terminal to the recessed portion of the first pad surface so that the drain and gate terminals of the second FET chip are co-planar with the un-recessed portion of the first pad surface and with the leads.

17. The method of claim 16 wherein the steps of attaching employ attach material selected from a group including solders, conductive adhesives, and polymeric compounds with z-axis conductor.

18. The method of claim 16 further including the steps of connecting the pad to the switch node terminal of the system, the clip to the grounded output terminal of the system, and the drain of the second FET chip to a board terminal as input to the system.

19. The method of claim 16 further including, after the step of attaching a clip and before the step of encapsulating, the steps of:
    attaching a driver-and-control chip vertically on the second flat side of the clip; and
    connecting the terminals of the driver-and-control chip to respective leads using bonding wires.

20. The method of claim 19 wherein the step of encapsulating also incorporates the attached driver-and-control chip and the bonding wires.

* * * * *